(12) United States Patent
Masson et al.

(10) Patent No.: US 8,531,856 B2
(45) Date of Patent: Sep. 10, 2013

(54) MEMBER FOR SYNCHRONOUS RECTIFIER BRIDGE, RELATED SYNCHRONOUS RECTIFIER BRIDGE AND USE THEREOF

(75) Inventors: Philippe Masson, Yerres (FR); Gaël Blondel, Sucy en Brie (FR)

(73) Assignee: Vaelo Equipements Electriques Moteur, Creteil Cedex (FR)

( * ) Notice: Subject to any disclaimer, the term of this patent is extended or adjusted under 35 U.S.C. 154(b) by 767 days.

(21) Appl. No.: 12/443,741

(22) PCT Filed: Sep. 26, 2007

(86) PCT No.: PCT/FR2007/052008
§ 371 (c)(1),
(2), (4) Date: Dec. 8, 2009

(87) PCT Pub. No.: WO2008/059145
PCT Pub. Date: May 22, 2008

(65) Prior Publication Data
US 2010/0091533 A1    Apr. 15, 2010

(30) Foreign Application Priority Data

Nov. 16, 2006  (FR) ...................................... 06 54927

(51) Int. Cl.
*H02M 7/217* (2006.01)
(52) U.S. Cl.
USPC ........................................................ 363/127

(58) Field of Classification Search
USPC ............................................................ 363/127
See application file for complete search history.

(56) References Cited

U.S. PATENT DOCUMENTS

| 6,421,262 | B1* | 7/2002 | Saxelby et al. | 363/127 |
| 2002/0141214 | A1* | 10/2002 | Grover | 363/125 |
| 2003/0095423 | A1* | 5/2003 | Hirst | 363/127 |
| 2003/0151432 | A1 | 8/2003 | Pelliconi | |

FOREIGN PATENT DOCUMENTS

| EP | 1 133 048 A | 9/2001 |
| FR | 2 884 079 A | 10/2006 |
| WO | WO 2004/034439 | 4/2004 |

* cited by examiner

*Primary Examiner* — Jue Zhang
(74) *Attorney, Agent, or Firm* — Berenato & White, LLC

(57) ABSTRACT

The member for a synchronous rectifier bridge (14) typically includes at least first and second connection terminals (B+, P), at least one field-effect transistor (15) having source and drain electrodes (16, 17) respectively connected to the first and second terminals (B+, P), and at least one comparator for comparing at least a first voltage source having a predetermined reference voltage and at least a first voltage difference between the voltages applied to the first and second terminals (B+, P) and having an output connected to a gate electrode (21) of the transistor (15). The member (14) further includes at least one load pump (25) providing, from the applied voltages, at least one supply voltage (VH, VL), of an amplifier from said applied voltages.

11 Claims, 5 Drawing Sheets

MEMBER FOR SYNCHRONOUS RECTIFIER BRIDGE, RELATED SYNCHRONOUS RECTIFIER BRIDGE AND USE THEREOF

CROSS-REFERENCE TO RELATED APPLICATIONS AND CLAIM TO PRIORITY

This application relates to International Application No. PCT/FR2007/052008 filed Sep. 26, 2007 and French Patent Application No. 0654927 filed Nov. 16, 2006, of which the disclosures are incorporated herein by reference and to which priority is claimed.

TECHNICAL FIELD OF THE INVENTION

The present invention relates to a synchronous rectifier bridge member, particularly a bridge arm, as well as a voltage rectifier bridge comprising a plurality of this member.

The invention also relates to an electrical rotating machine using this same rectifier bridge.

TECHNOLOGICAL BACKGROUND OF THE INVENTION

Diode rectifier bridges, such as that shown in FIG. 1, are well known from the prior art.

The diodes used in this type of rectifier bridges, whether these are junction, PIN or Schottky diodes, have a considerable voltage drop in the conducting direction at low voltage.

This represents a disadvantage in the field of motor vehicle equipment which runs at low voltage. For example, the electrical output of an alternator is degraded as a result.

To improve the overall output of the electrical equipment implementing diode bridges, it is known to use synchronous rectifiers having switches (transistors, thyristors, triacs, etc).

Document EP1347564 describes a three-phase synchronous rectifier bridge of this type, the schematic diagram of which is taken up in FIG. 2.

The gates of the transistors of the N-channel MOSFET (insulated gate field effect transistor) or IGBT (insulated gate bipolar transistor)-type which switch-operate are controlled according to the absolute value of the differences in voltages between phases so as to produce, at the output of the bridge, a continuous voltage.

It is also known from document WO2004/034439 to drive the MOSFETs in linear mode in the conducting state, i.e. to linearly drive their internal resistor by means of a servo-mechanism so as to simulate the behaviour of ideal diodes.

In document FR2884079, the company VALEO EQUIPEMENTS ELECTRIQUES MOTEUR discloses a method for controlling a MOS transistor, which is intended to be implemented in an electric converter bridge (inverter, or rectifier), for the purpose of overcoming the accumulation of electrical charges in the transistor which is responsible for the delay in switching, which produces a large recovery current. The schematic diagram of the corresponding device is given in FIG. 3.

The technical developments recalled above have lead to an optimisation of the output of synchronous rectifiers.

However, the transistors of known synchronous rectifiers require an additional control and supply circuit, and cannot replace a diode in order to transform an asynchronous rectifier bridge into a synchronous rectifier bridge.

GENERAL DESCRIPTION OF THE INVENTION

The aim of the present invention is therefore to insert, with the power components, the power supply and the control mechanism thereof into a single box, such as to make the use of a synchronous rectifier bridge member possible instead of one or more diodes.

It relates precisely to a synchronous rectifier bridge member having at least a first connection terminal, and at least a second connection terminal.

This member is of the type of those known per se including at least a first field effect transistor, the first source and the first drain of which are connected to the first and second connection terminals respectively, and at least a first operational amplifier comprising a first feedback loop, the first output of which is connected to the first gate of the first transistor.

This amplifier is mounted as a comparator for at least a first voltage source having a pre-determined reference voltage and for at least a first voltage difference between voltages applied to the first and second connection terminals.

The synchronous rectifier bridge member according to the invention is notable in that it further comprises a load pump producing at least one of the supply voltages of the first amplifier from the voltages applied to the connection terminals.

Preferably, the load pump is controlled by an oscillator fed by the load pump itself.

The synchronous rectifier bridge member according to the invention advantageously includes a circuit for setting the load pump in standby when the average amplitude or frequency of at least one of the applied voltages is less than a pre-determined value.

According to the invention, advantage shall be gained from a synchronous rectifier bridge member comprising at least a second field effect transistor, the second source and the second drain of which are connected to the second connection terminal and to a third connection terminal respectively, and further including a second operational amplifier comprising a second feedback loop, which amplifier is fed at least partially by the supply voltages generated by the load pump, and the second output of which is connected to the second gate of the second transistor.

This second amplifier is mounted as a comparator for a second voltage source having the same pre-determined reference voltage and for a second difference in voltage between the voltage of the applied voltages that is present on the second connection terminal and the voltage of the applied voltages that is present on the third connecting terminal.

In this embodiment of the invention, the load pump is preferably optionally fed between the first and third connection terminals according to the average value or the frequency of the voltage of the applied voltages that is present on the second connection terminal. Alternatively or simultaneously, the second connection terminal of the member is advantageously connected to the third connection terminal by a shunt circuit, comprising a resistor, when the frequency of the voltage of the applied voltages that is present on the second terminal is zero.

The synchronous rectifier bridge member according to the invention preferably comprises an additional connection terminal having a diagnostic signal indicating a failure of this member.

In accordance with the aim of the invention, the synchronous rectifier bridge member is produced very advantageously in the form of an overmoulded box, having a metallic bottom connected to the second or third connection terminal, and one or more insulated leadframes connected to the first connection terminal and supporting the first transistor, or to the first and second connection terminals and supporting the first and second transistors.

Preferably, the first amplifier and/or the second amplifier, the load pump, and/or the oscillator, and/or the standby-setting circuit, and/or the shunt circuit, and/or the diagnostic circuit are produced in the form of one or more ASIC (application specific integrated circuit type) circuits, preferably a single ASIC circuit.

The invention also relates to a synchronous rectifier bridge which is notable in that it is made up by one or more rectifier bridge members having the above features, as well as a generator-type electrical rotating machine incorporating at least such a synchronous rectifier bridge.

These few essential specifications would have made obvious to a person skilled in the art the advantages brought by the synchronous rectifier bridge member, the corresponding rectifier bridge and the use thereof in relation to the prior art.

The detailed specifications of the invention are given in the following description with reference to the appended drawings. It should be noted that these drawings have no other purpose than to illustrate the text of the description and in no way represent a limitation of the scope of the invention.

DESCRIPTION OF THE PREFERRED
EMBODIMENTS OF THE INVENTION

Figure 1:
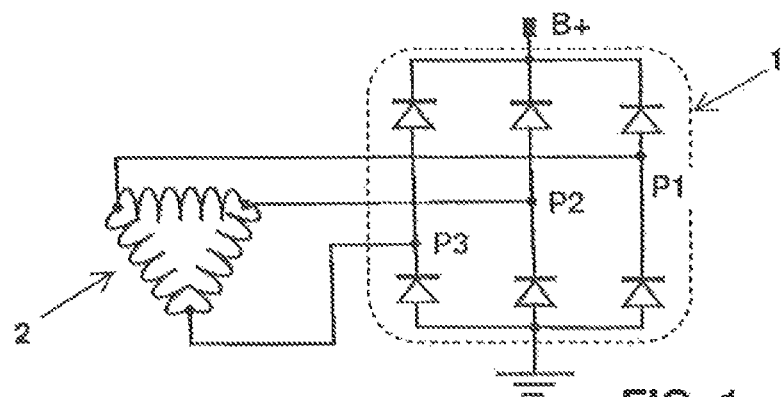
FIG. 1 shows the conventional schematic diagram of a diode asynchronous three-phase rectifier bridge which is known from the prior art.
Figure 2:
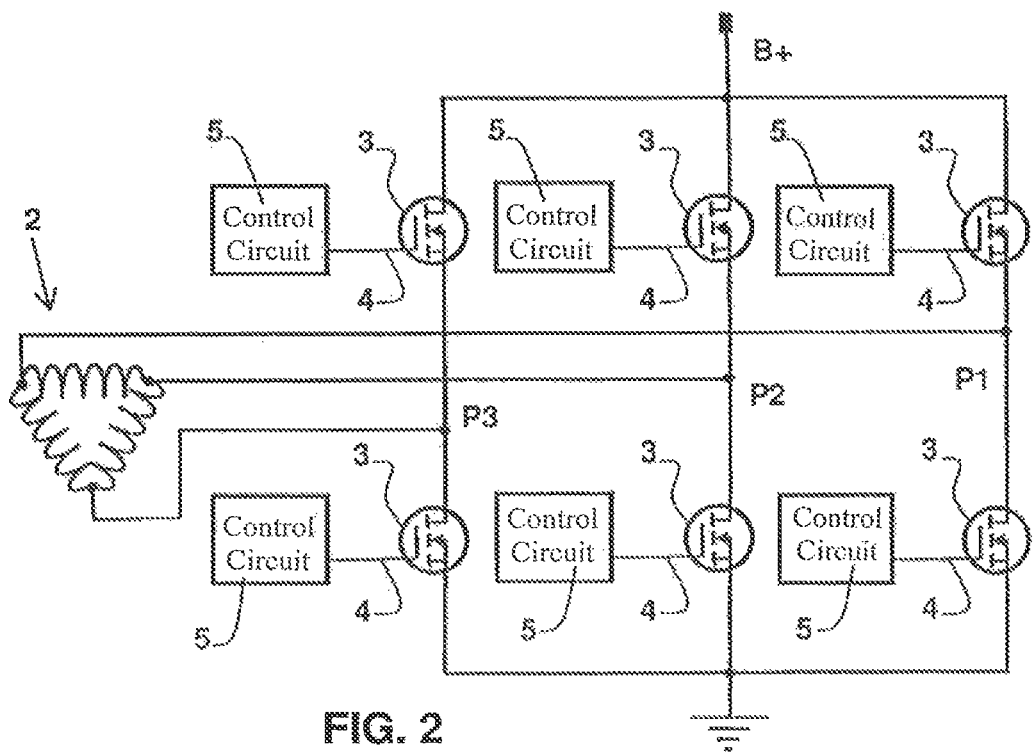
FIG. 2 shows the schematic diagram of a three-phase synchronous rectifier bridge using transistors with switching, which is known from the prior art.
Figure 3:
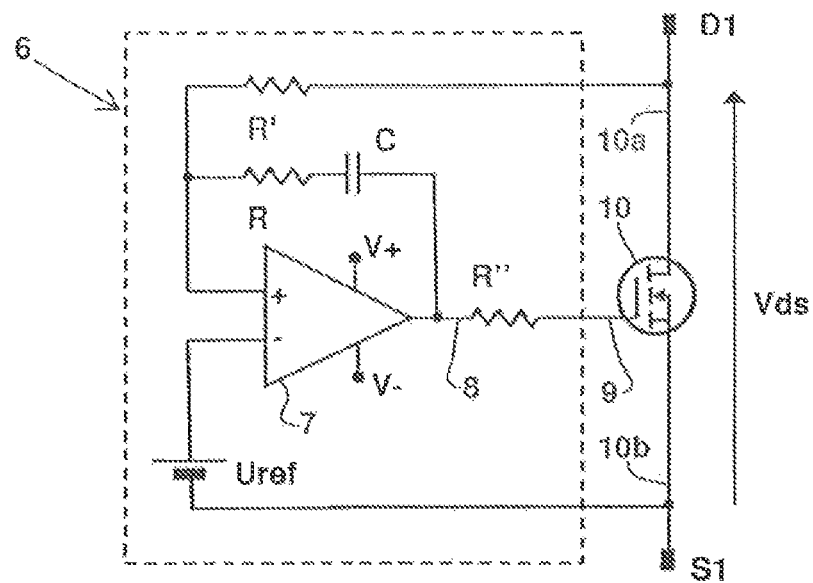
FIG. 3 shows the schematic diagram of a device for controlling a MOS transistor which is known from the prior art, and is already implemented in an electric converter bridge.
Figure 4:
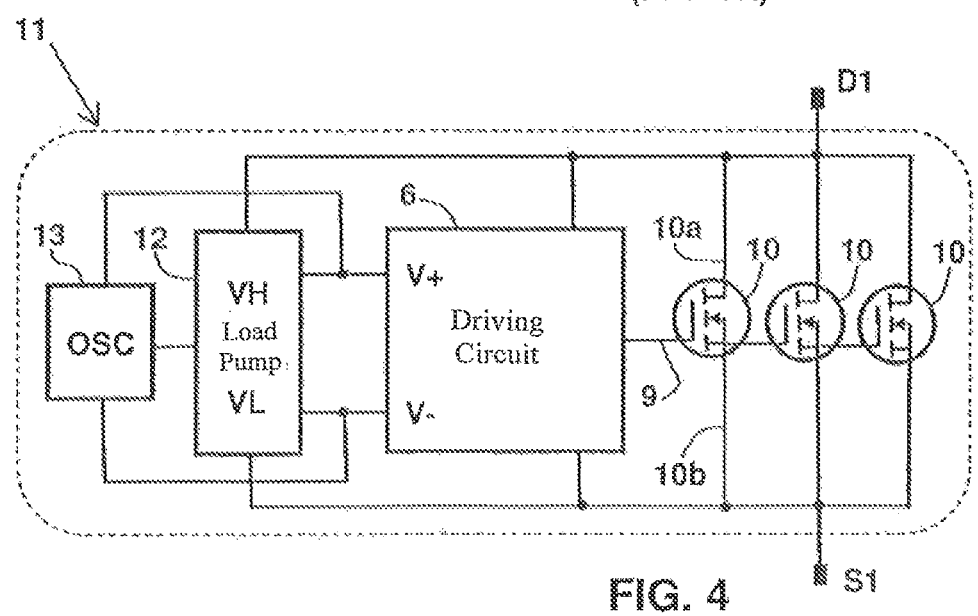
FIG. 4 shows the overview diagram of a first preferred embodiment of the synchronous rectifier bridge member according to the invention.
Figure 5:
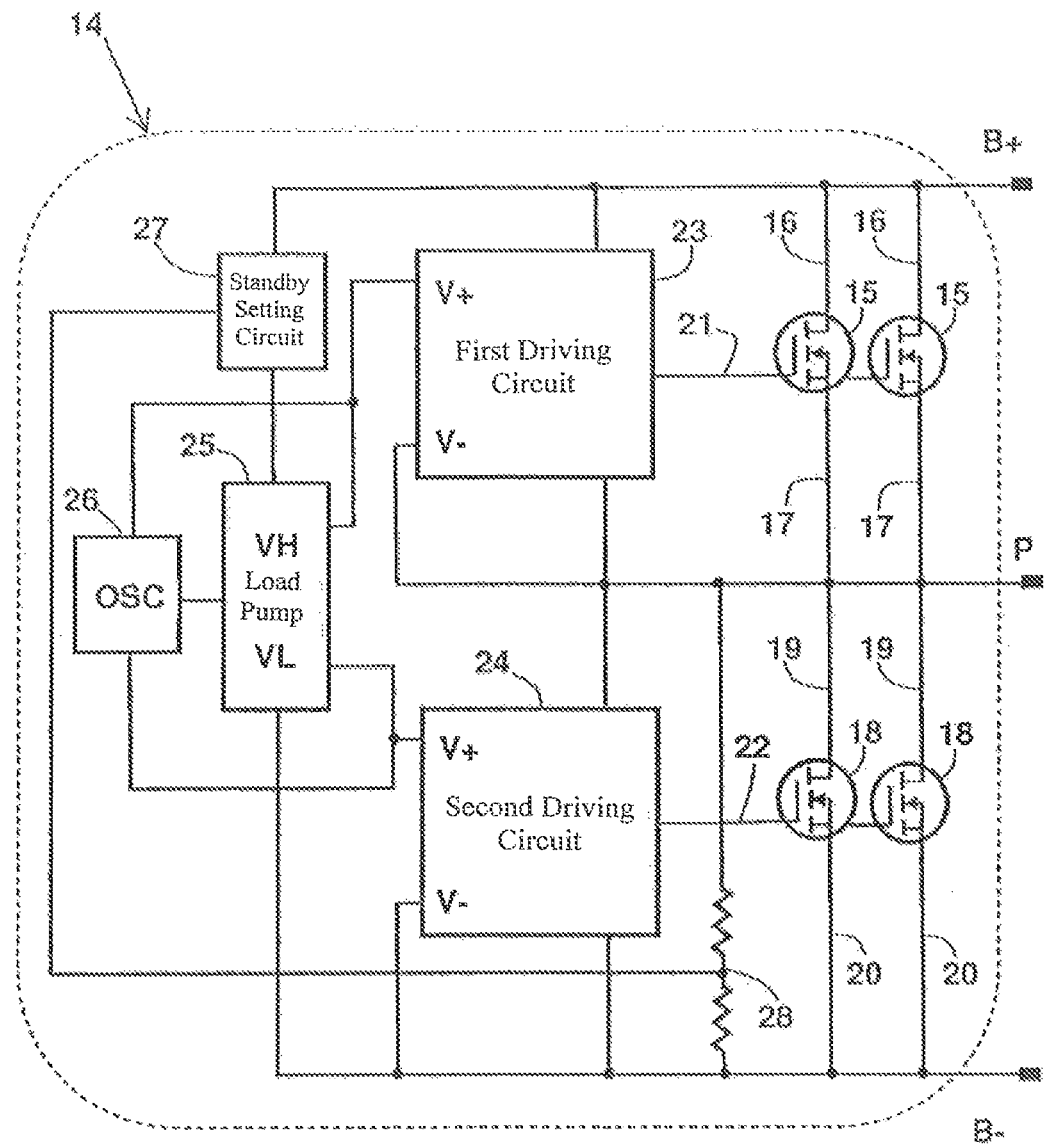
FIG. 5 shows the overview diagram of a second preferred embodiment of the synchronous rectifier bridge member according to the invention.

Recalling the major stages of the development of the prior art of rectifier bridges, which stages are illustrated by the devices shown in diagrams in FIGS. 1, 2 and 3, will allow a good understanding of the benefit of the invention shown in a synoptic manner in FIGS. 4 and 5.

FIG. 1 shows a three-phase rectifier bridge 1 producing a positive continuous voltage B+ in relation to the earth from the alternating voltages at the terminals P1, P2, P3 of the windings 2 of a three-phase alternator.

In the motor vehicle field, the alternator operates at low voltage so as to provide, after rectification, a continuous voltage B+ of the order of 14V feeding the battery and the on-board network. The drop in voltage at the terminals of the diodes in the conducting direction, of the order of 0.7V, produces a large relative voltage drop of the order of 10% in the supply circuit.

In the synchronous rectifier bridge shown in FIG. 2, the diodes 1 of the previous assembly are replaced with N-channel MOSFET transistors 3 that switch-operate. The extremely weak resistance of the MOSFET transistors 3 in the conducting state only produces additional voltage drops of the order of a few dozen millivolts in the circuit of the windings of phases 2.

In the stage of the development of the technology illustrated by the device shown in FIG. 2, the MOSFET transistors 3 are "on-off" controlled by switching voltages applied to the gates 4 thereof by control circuits 5 operating in a binary manner.

The following improvement has consisted in replacing the control circuits 5 in binary mode with circuits 6 for driving the MOSFET transistors in linear mode, such as that shown in FIG. 3, such as to either make the voltage Vds constant between drain D1 and source S1, or to minimise the accumulation of charges during the conducting state.

In order to do this, the driving circuit 6 in linear mode includes an operational amplifier 7 mounted as a comparator for a reference voltage source Uref and for the drain-source voltage Vds, the output 8 of which is connected by a resistor R" to the gate 9 of the MOSFET 10. The operational amplifier 7 comprises a feedback loop made up by a circuit RC.

The operational amplifier 7 is fed by voltage sources connected to the positive supply terminal V+ thereof and to the negative supply terminal V− thereof having sufficient levels, with respect to the drain D1 and source S1 potentials, such that the output voltage effectively controls the gate 9 of the N-channel MOSFET transistor 10.

The need to provide the control 5 or driving 6 circuits with appropriate power supplies is precisely the disadvantage of the devices shown in FIGS. 2 and 3 with respect to the assembly of FIG. 1: the MOSFET transistors 3, 10 cannot simply replace the rectifying diodes 1.

In a first preferred embodiment, of which FIG. 4 is an overview diagram, the invention consists therefore in providing the supply V+, V− of the circuit 6 for driving in linear mode the N-channel MOSFET transistor 10, or several in parallel, from the voltage at the terminals D1, S1 thereof.

Since the assembly has an independent supply, it forms a synchronous rectifier bridge member 11 between a first connection terminal D1 and a second connection terminal S1 which replaces, in a transparent manner, a rectifying diode, the anode of which would be the first terminal D1, and the cathode the second terminal S1.

A load pump 12 in parallel on the connection terminals D1, S1 generates the high VH and low VL supply voltages required by the operational amplifier 7 of the driving circuit 6.

The load pump 12 is controlled by an oscillator 13, which itself is fed by the generated voltages VH, VL.

A second preferred embodiment of the invention is a synchronous rectifier bridge member 14, of which FIG. 5 gives the overview diagram, replacing, in a transparent manner, a diode asynchronous rectifier bridge arm, such as that shown in FIG. 1.

The member 14 therefore comprises three connection terminals: a first connection terminal B+ corresponding to the positive pole of the rectifier bridge, a second terminal P connected to one of the phases of the alternator, and a third terminal B− which is generally earthed.

In a manner similar to the assembly for replacing a single diode, the assembly for replacing the diode bridge arm includes a first N-channel MOSFET transistor 15, or several in parallel, the drain 16 of which is connected to the first connection terminal B+, and the source 17 of which is connected to the second connection terminal P.

It further includes a second N-channel MOSFET transistor 18, or several in parallel, the drain 19 of which is connected to the second connection terminal P, and the source 20 of which is connected to the third connection terminal B−.

The gates 21, 22 of the first and second MOSFET transistors 15, 18 are each driven by a driving circuit 23, 24 such as that shown in FIG. 3.

The driving circuits 23, 24 are fed by a load pump 25 generating high VH and low VL supply voltages from the voltage between the first B+ and third B− terminals.

The high supply voltage VH feeds the positive supply terminal V+ of the first driving circuit 23, the negative supply terminal V− of which is connected to the second connection terminal P.

The low supply voltage VL feeds the positive supply terminal V+ of the second driving circuit 24, the negative supply terminal V− of which is connected to the third connection terminal B−.

This load pump 25 is controlled by an oscillator 26 which itself is fed by the generated supply voltages VH, VL.

A circuit 27 for setting the load pump 25 in standby enters into operation according to the average amplitude of the voltage drawn by a resistance bridge 28 between the second connection terminal P, i.e. the phase terminal, and the third connection terminal B−, i.e., generally, the earth.

When the average amplitude is less than a pre-determined value, the standby-setting circuit 27 isolates the load pump 25 from the first terminal B+.

This under-voltage protection allows the deactivation of the synchronous rectification if the voltage at the terminals of the alternator is not sufficient for correct control of the transistors 15, 18, which could destroy them.

Stopping the load pump 25 is also advantageously triggered when the frequency of the phase voltage is less than a minimal frequency.

In this case, the synchronous rectifier bridge member 14 acts as a conventional diode bridge thanks to the parasitic diodes of the MOSFET transistors 15, 18.

Preferably, the circuits 23, 24 for driving the MOSFET transistors earth the second connection terminal P, or phase terminal, via a shunt circuit including a resistor when the frequency of the phase voltage is zero, i.e. when the alternator has stopped.

An additional connection terminal sends back a diagnostic signal indicating the failure of the member 14 (which could result in the alternator overheating).

Figure 6:
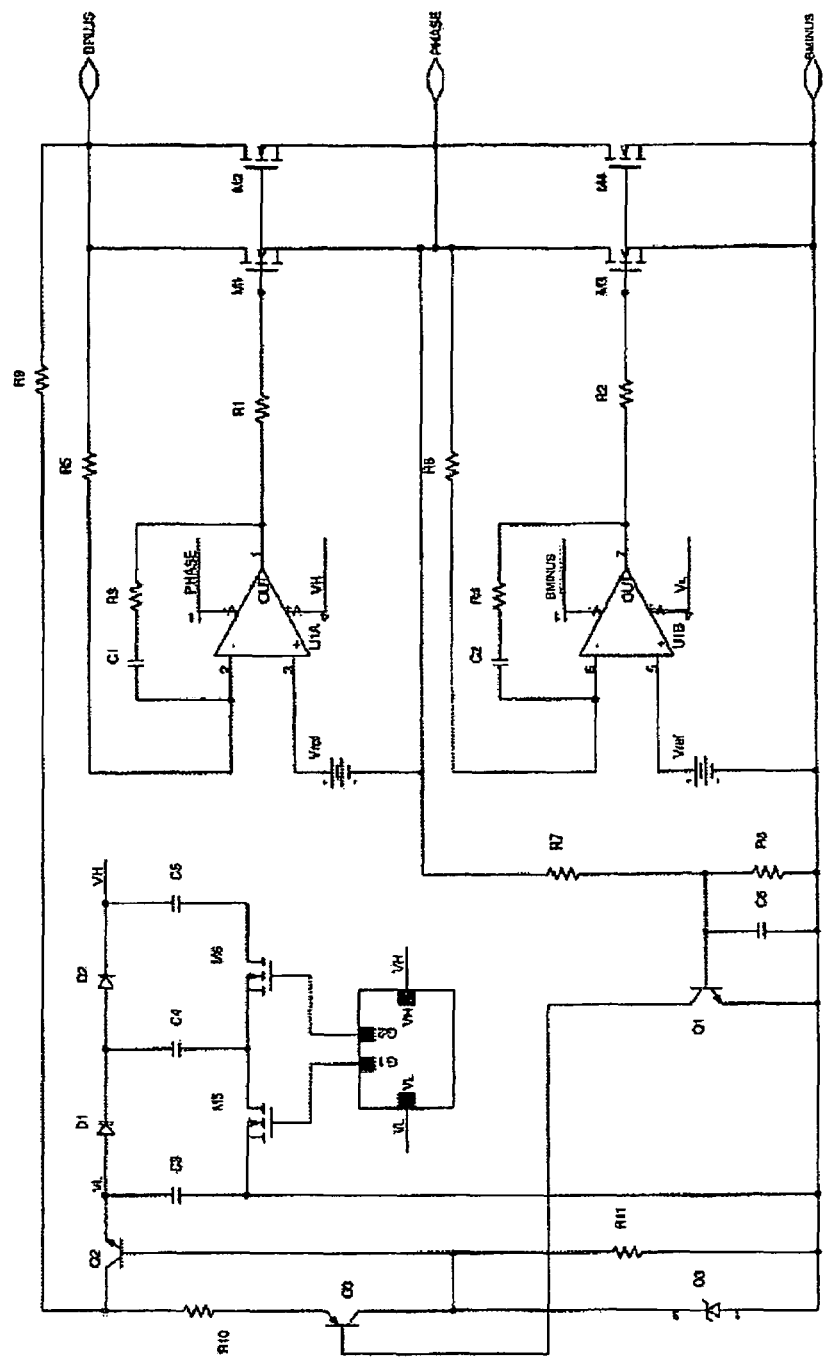
FIG. 6 shows the schematic diagram of the second preferred embodiment of the synchronous rectifier bridge member according to the invention.

The schematic diagram of the synchronous rectifier bridge member 14 according to the second preferred embodiment of the invention is given in FIG. 6.

The detail of the driving circuits 23, 24, which is known per se, does not require specific comment.

The load pump 25 generating the supply voltages VH and VL includes two diodes D1, D2 and three capacitors C3, C4, C5, the parallel charging and in-series discharge of which is controlled by two N-channel MOSFET transistors M5, M6, the gates of which are driven by the outputs G1, G2 of the oscillator 26.

The standby-setting circuit 27 includes a NPN transistor Q2 which functions as a switch in the circuit for feeding the load pump 25 between the first connection terminal B+ and the third connection terminal B− of the synchronous rectifier bridge member 14.

The base of this transistor Q2 is controlled by the voltage drawn between the phase terminal P and the third terminal B− by the resistance bridge 28 after filtering by a capacitor C6 and cascade amplification by a NPN transistor Q1 followed by a PNP transistor Q3.

The synchronous rectifier bridge member according to the invention is preferably produced in the form of an IML (Insulated Moulded Leadframe) technology overmoulded box.

Figure 7:
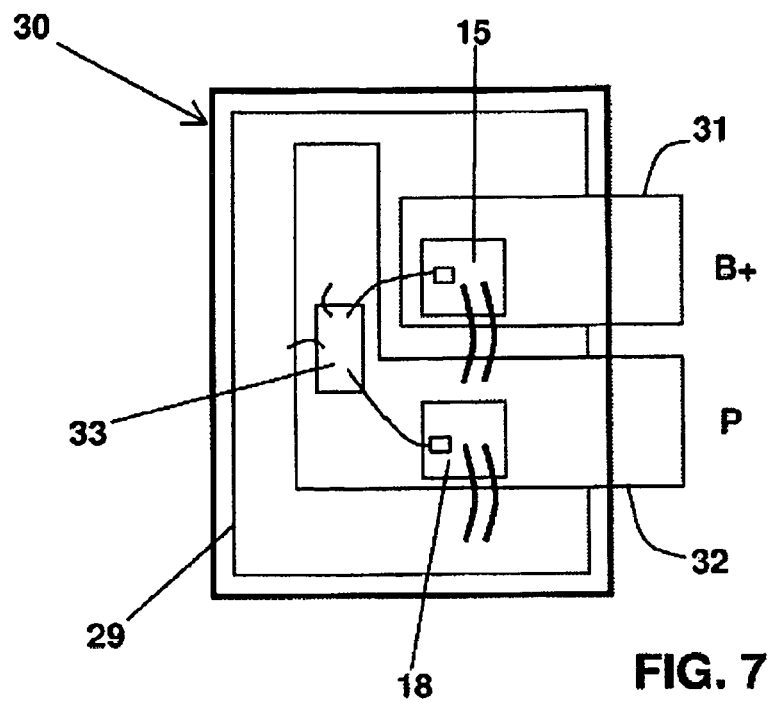
FIG. 7 schematically shows the structure of an integrated circuit corresponding to the second preferred embodiment of the invention.

FIG. 7 schematically shows an example of integrating, into IML technology, the synchronous rectifier bridge member 14 according to the second embodiment of the invention, i.e. a rectifier bridge arm.

The metallic bottom 29 of the overmoulded box 30 forms the third connection terminal B− of the member 14 and dissipates heat.

The first and second leadframes 31, 32 corresponding to the first and second connection terminals B+, P respectively of the member 14 are stuck on the metallic bottom 29 using thermally conductive but electrically insulating adhesive (glass bead silicone for example).

The first leadframe 31 having a substantially rectangular elongated shape supports the first MOSFET transistor 15 (or several in parallel).

The second leadframe 32, which is substantially L-shaped, and juxtaposed to the first leadframe 31, supports the second MOSFET transistor 18 (or several in parallel), as well as an ASIC (Application Specific Integrated Circuit) circuit 33.

The ASIC circuit 33 includes the load pump 25, the oscillator 26, the standby-setting circuit 27 and the circuits 23, 24 for driving the MOSFETs 15, 18.

It also preferably includes the shunt circuit and the diagnostic circuit of the member 14.

The integration of the synchronous rectifier bridge member 14 into an independent module 30 allows it to be packaged in a button member in the same manner as a pair of diodes forming a conventional rectifier bridge arm.

Figure 8:
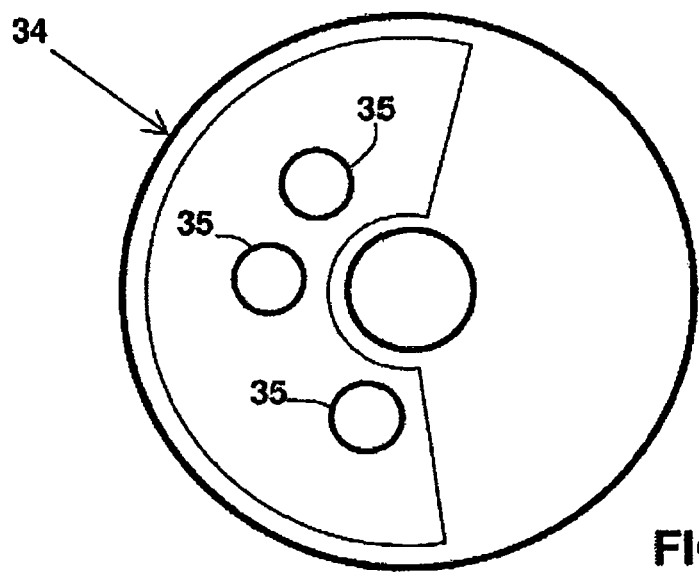
FIG. 8 is a schematic view of a three-phase electrical rotating machine incorporating a rectifier bridge made up of three bridge members according to the second embodiment of the invention.

As a result, the view of FIG. 8, where the person skilled in the art would think he/she can easily recognise the view of a face of a three-phase alternator 34 having three button members 35 each conventionally containing a diode rectifier bridge arm, is an example of use of the synchronous rectifier bridge member according to the invention: the replacement of the old diode button members of the alternators 34 with new MOSFET members 35 is completely transparent.

Of course, the invention is not limited to the preferential embodiments alone which are described above, relating to the integration of a circuit equivalent to one or two rectifying diodes.

A similar description could apply to synchronous rectifier bridge members equivalent to more than two diodes.

Furthermore, the specific types of the semi-conductor members specified above, i.e. N-channel MOSFET, PNP or NPN transistors, are only given by way of example.

The invention covers all possible alternative embodiments implementing any other type of semi-conductor member having functionalities equivalent to those cited, at the cost, possibly, of changing over the polarities of the applied voltages, insofar as these alternatives remain within the scope defined by the claims hereafter.

The invention claimed is:

1. A synchronous rectifier bridge member (11, 14) comprising:
   at least a first connection terminal (D1, B+);
   at least a second connection terminal (S1, P);
   at least a first field effect transistor (10, 15) including a first drain (10a, 16) and a first source (10b, 17) connected to said at least first and second terminals (D1, B+; S1, P) respectively;

at least a first operational amplifier (7, U1A) comprising a first feedback loop (R, C; R3, C1) and a first output (8) connected to a first gate (9, 21) of said first transistor (10, 15), said first feedback loop (R, C; R3, C1) mounted as a comparator for at least a first voltage source (Uref, Vref) having a pre-determined reference voltage and for at least a first voltage difference (Vds) between applied voltages applied to said at least first and second terminals (D1, B+; Si, P);

a load pump (12, 25) producing at least one of supply voltages (VH, VL) of said first amplifier (7, U1A) from said applied voltages; and a circuit (27) for setting said load pump (25) in standby when an average frequency of at least one of said applied voltages is less than a pre-determined value.

2. The synchronous rectifier bridge member (11, 14) according to claim 1, wherein said load pump (12, 25) is controlled by an oscillator (13, 26) fed by said load pump (12, 25).

3. The synchronous rectifier bridge member (11, 14) according to claim 1, further comprising at least a second field effect transistor (18), a second drain (19) and a second source (20) of which are connected to said second terminal (P) and to a third connection terminal (B−) respectively, and a second operational amplifier (U1B), fed at least partially by said supply voltages (VH, VL) generated by said load pump (25), comprising a second feedback loop (R4, C2), which amplifier is mounted as a comparator for a second voltage source (Vref) having said pre-determined reference voltage and for a second difference in voltage between the voltage of said applied voltages that is present on said second terminal (P) and the voltage of said applied voltages that is present on said third terminal (B−), and a second output of which is connected to a second gate (22) of said second transistor (18).

4. The synchronous rectifier bridge member (14) according to claim 3, wherein said load pump (25) is fed between said first and third terminals (B+, B−) according to the average frequency of the voltage of said applied voltages that is present on said second terminal (P).

5. The synchronous rectifier bridge member (14) according to claim 3, wherein said second terminal (P) is connected to said third terminal (B−) by a shunt circuit, comprising a resistor, when the frequency of the voltage of said applied voltages that is present on said second terminal (P) is zero.

6. The synchronous rectifier bridge member (11, 14) according to claim 3, wherein it is produced in the form of an overmoulded box (30), having a metallic bottom (29) connected to said second terminal (S1) or said third terminal (B−), and one or more insulated leadframes (31, 32) connected to said first terminal (D1), and supporting said first transistor (10), or to said first and second terminals (B+, P), and supporting said first and second transistors (15, 18).

7. The synchronous rectifier bridge member according to claim 1, further comprising an additional connection terminal having a diagnostic signal indicating a failure of said member.

8. The synchronous rectifier bridge member (11, 14) according to claim 1, wherein it is produced in the form of an overmoulded box (30), having a metallic bottom (29) connected to said second terminal (S1), and one or more insulated leadframes (31, 32) connected to said first terminal (D1), and supporting said first transistor (10), or to said first and second terminals (B+, P), and supporting said first transistor (15).

9. The synchronous rectifier bridge member (11, 14) according to claim 1, wherein said first amplifier (7, U1A) and said load pump (12, 25) are produced in the form of one or more ASIC circuits (33).

10. A synchronous rectifier bridge comprising one or more rectifier bridge members (11, 14) comprising:
at least a first connection terminal (D1, B+);
at least a second connection terminal (S1, P);
at least a first field effect transistor (10, 15) including a first drain (10a, 16) and a first source (10b, 17) connected to said at least first and second terminals (D1, B+; S1, P) respectively;
at least a first operational amplifier (7, U1A) comprising a first feedback loop (R, C; R3, C1) and a first output (8) connected to a first gate (9, 21) of said first transistor (10, 15), said first feedback loop (R, C; R3, C1) mounted as a comparator for at least a first voltage source (Uref, Vref) having a pre-determined reference voltage and for at least a first voltage difference (Vds) between applied voltages applied to said at least first and second terminals (D1, B+; S1, P);
a load pump (12, 25) producing at least one of supply voltages (VH, VL) of said first amplifier (7, U1A) from said applied voltages; and
a circuit (27) for setting said load pump (25) in standby when the average frequency of at least one of said applied voltages is less than a pre-determined value.

11. A generator-type electrical rotating machine (34) incorporating at least a synchronous rectifier bridge; said synchronous rectifier bridge comprising one or more rectifier bridge members (11, 14) comprising:
at least a first connection terminal (D1, B+);
at least a second connection terminal (S1, P);
at least a first field effect transistor (10, 15) including a first drain (10a, 16) and a first source (10b, 17) connected to said at least first and second terminals (D1, B+; S1, P) respectively;
at least a first operational amplifier (7, U1A) comprising a first feedback loop (R, C; R3, C1) and a first output (8) connected to a first gate (9, 21) of said first transistor (10, 15), said first feedback loop (R, C; R3, C1) mounted as a comparator for at least a first voltage source (Uref, Vref) having a pre-determined reference voltage and for at least a first voltage difference (Vds) between applied voltages applied to said at least first and second terminals (D1, B+; S1, P);
a load pump (12, 25) producing at least one of supply voltages (VH, VL) of said first amplifier (7, U1A) from said applied voltages; and
a circuit (27) for setting said load pump (25) in standby when the average frequency of at least one of said applied voltages is less than a pre-determined value.

* * * * *